United States Patent
Chen et al.

(10) Patent No.: US 8,847,405 B2
(45) Date of Patent: Sep. 30, 2014

(54) INTEGRATED CIRCUITS INCLUDING AIR GAPS AROUND INTERCONNECT STRUCTURES, AND FABRICATION METHODS THEREOF

(71) Applicant: Taiwan Semiconductor Manufacturing Company, Ltd., Hsinchu (TW)

(72) Inventors: Chii-Ping Chen, Taichung (TW); Chih-Hao Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/858,639

(22) Filed: Apr. 8, 2013

(65) Prior Publication Data

US 2013/0221541 A1 Aug. 29, 2013

Related U.S. Application Data

(63) Continuation of application No. 12/718,616, filed on Mar. 5, 2010, now Pat. No. 8,436,473.

(51) Int. Cl.
*H01L 23/48* (2006.01)
*H01L 21/768* (2006.01)
*H01L 23/522* (2006.01)
*H01L 23/538* (2006.01)

(52) U.S. Cl.
CPC .......... *H01L 23/5384* (2013.01); *H01L 21/768* (2013.01); *H01L 23/522* (2013.01)
USPC ........... 257/774; 257/751; 257/773; 257/775; 257/E12.16; 257/E21.584

(58) Field of Classification Search
USPC ................ 257/620, 622, 773, 774, 751, 775, 257/E23.16, E21.584
See application file for complete search history.

(56) References Cited

U.S. PATENT DOCUMENTS

| | | | |
|---|---|---|---|
| 6,022,808 A | 2/2000 | Nogami et al. | |
| 6,075,710 A * | 6/2000 | Lau | 361/760 |
| 6,287,951 B1 | 9/2001 | Lucas et al. | |
| 6,555,171 B1 | 4/2003 | Lopatin | |
| 6,576,543 B2 | 6/2003 | Lin et al. | |
| 6,630,393 B2 | 10/2003 | Yamamoto | |
| 6,756,309 B1 | 6/2004 | Chen et al. | |
| 7,351,628 B2 | 4/2008 | Forbes et al. | |
| 7,365,026 B2 | 4/2008 | Jeng et al. | |
| 7,560,375 B2 | 7/2009 | Filippi et al. | |

(Continued)

OTHER PUBLICATIONS

Chen, Hsien-Wei et al., "A Self-Aligned Air Gap Interconnect Process", Taiwan Semiconductor Manufacturing Company, Ltd. (TSMC), Hsinchu, Taiwan, R.O.C., 987-1-4244-1911-1-08; 2008, IEEE, pp. 34-36.

*Primary Examiner* — Jasmine Clark
(74) *Attorney, Agent, or Firm* — Lowe Hauptman & Ham, LLP

(57) ABSTRACT

An integrated circuit which includes an interconnect structure disposed at least partially in at least one opening of a dielectric layer. The integrated circuit further includes at least one air gap disposed between the dielectric layer and the interconnect structure. The integrated circuit further includes at least one first liner material disposed under the at least one air gap, the at least one first liner material extending along a bottom portion of a sidewall of the at least one opening of the dielectric layer.

20 Claims, 9 Drawing Sheets

(56) References Cited

U.S. PATENT DOCUMENTS

| | | |
|---|---|---|
| 7,754,601 B2 | 7/2010 | Chen et al. |
| 7,803,713 B2 | 9/2010 | Chen et al. |
| 7,973,409 B2 * | 7/2011 | Yang et al. .................. 257/751 |
| 2002/0111016 A1 | 8/2002 | Farquhar et al. |
| 2009/0108379 A1 | 4/2009 | Oosuka et al. |

* cited by examiner

INTEGRATED CIRCUITS INCLUDING AIR GAPS AROUND INTERCONNECT STRUCTURES, AND FABRICATION METHODS THEREOF

RELATED APPLICATIONS

The present application is a continuation of U.S. application Ser. No. 13/397,102, filed Feb. 15, 2012, which is a continuation of U.S. application Ser. No. 12/716,363, filed Mar. 3, 2010, now U.S. Pat. No. 8,436,473, which in turn claims priority of U.S. Application Ser. No. 61/160,951, filed on Mar. 17, 2009, the entire disclosures of which are incorporated herein by reference.

The present application is related to U.S. application Ser. No. 12/132,233, entitled "SEMICONDUCTOR INTERCONNECT AIR GAP FORMATION PROCESS," filed on Jun. 3, 2008, now U.S. Pat. No. 7,754,601 and U.S. Provisional Application No. 61/176,002, entitled "INTEGRATED CIRCUITS INCLUDING ILD STRUCTURE, SYSTEMS, AND FABRICATION METHODS THEREOF," filed on May 5, 2009, which are incorporated herein by reference in their entireties.

TECHNICAL FIELD

The present disclosure relates generally to the field of semiconductor devices, and more particularly, to integrated circuits including air gaps around interconnect structures and fabrication methods thereof.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
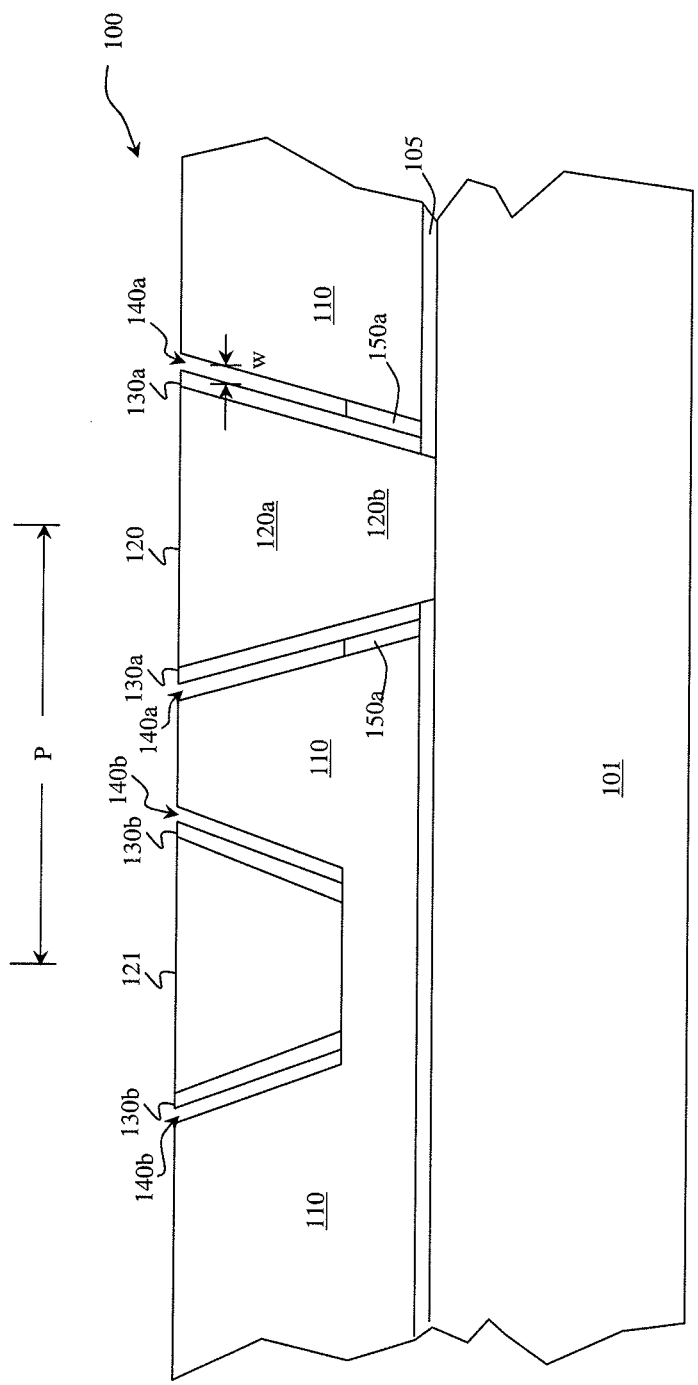
FIG. 1 is a schematic cross-sectional view of a first exemplary integrated circuit including at least one air gap that is disposed around an interconnect structure.

As mentioned above, the trend in the semiconductor industry is towards the miniaturization or scaling of integrated circuits, in order to provide smaller ICs and improve performance, such as increased speed and decreased power consumption. Low dielectric constant (low-k) dielectrics have been proposed to reduce parasitic capacitances between metallic lines and/or metallic layers. The parasitic capacitances can increase a resistance-capacitance (RC) time delay and, therefore, slow down the operation speed of the integrated circuit.

It is understood that the following disclosure provides many different embodiments, or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

An embodiment of the present application provides an integrated circuit including at least one air gap around an interconnect structure. The integrated circuit includes a dielectric layer disposed over a substrate. The dielectric layer includes at least one opening therein. An interconnect structure is disposed at least partially in the at least one opening. At least one first liner material is disposed around the interconnect structure. At least one air gap is disposed between the dielectric layer and the at least one first liner material. At least one second liner material is disposed below the at least one air gap and between the dielectric layer and the at least one first liner material. By forming the air gap around the interconnect structure, a parasitic capacitance between the interconnect structure and a neighboring interconnect structure can be desirably reduced. The resistance-capacitance (RC) time delay can be improved.

FIG. 1 is a schematic cross-sectional view of a first exemplary integrated circuit including at least one air gap that is disposed around an interconnect structure. In FIG. 1, an integrated circuit 100 can include at least one dielectric layer, such as a dielectric layer 110, disposed over a substrate 101. In some embodiments, the substrate 101 can include active regions, source/drain regions of transistors, interconnection structures, such as contacts, vias, and metallic lines, devices, circuits, other semiconductor structures, or any combinations thereof.

In some embodiments, the substrate 101 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the gradient SiGe feature is formed over a silicon substrate. In yet another embodiment, the gradient SiGe feature is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In some other examples, the compound semiconductor substrate may have a multilayer structure, or the substrate may include a multilayer compound semiconductor structure.

Referring again to FIG. 1, in some embodiments, the dielectric layer 110 may include at least one material, such as carbon-containing silicon oxide, carbon-containing silicon nitride, carbon-containing silicon oxynitride, carbon-containing low-k dielectric material, ultra low-k dielectric material, or any combinations thereof. In some embodiments, the dielectric layer 110 can be made of a low-k dielectric material having a dielectric constant k less than or equal to 3, such as Black Diamond® available from Applied Materials, Incorporated®. In some other embodiments, the dielectric layer 110 may be made of such as, without limitation, fluorinated silicate glass (FSG) or undoped silicate glass (USG). In still other embodiments, the material selected for dielectric layer 110 can be susceptible to etching by anisotropic dry gas plasma etching chemistries.

In some embodiments, additional dielectric layer can be formed between the dielectric layer 110 and the substrate 101. For example, an etch stop layer (ESL) 105 can be formed over the substrate 101. The ESL 105 can include materials such as silicon nitride, silicon oxynitride, a silicon-carbon based material, such as silicon carbide (SiC), carbon-doped silicon oxide, or any combinations thereof.

Referring to FIG. 1, the integrated circuit 100 can include at least one interconnect structure, such as interconnect structures 120 and 121. Each of the interconnect structures 120 and 121 can be disposed in openings (not labeled) of the dielectric layer 110. The interconnect structures 120 and 121 can include at least one material such as copper (Cu), tungsten (W), aluminum (Al), Al/Cu, other conductive materials, or any combinations thereof.

In some embodiments, at least one barrier layer (not shown) can be disposed adjacent the sidewalls and/or bottoms of the interconnect structures 120 and 121. The barrier layer can include at least one material such as tantalum (Ta), tantalum nitride (TaN), titanium (Ti), titanium nitride (TiN), tantalum silicon nitride (TaSiN), W, tungsten nitride (WN), other barrier layer materials, or any combinations thereof. The barrier layer can be formed, for example, by a chemical vapor deposition (CVD) process, a physical vapor deposition (PVD) process, a plasma enhanced CVD (PECVD) process, an atomic layer deposition (ALD) process, other deposition processes, or any combinations thereof.

Referring to FIG. 1, liner materials 130a and 130b can be disposed around the interconnect structures 120 and 121, respectively. In some embodiments, the liner materials 130a and 130b can include at least one material such as silicon nitride, silicon oxynitride (SiON), silicon oxycarbide (SiOC), silicon carbon nitride (SiCN), silicon carbon oxynitride (SiCON), silicon carbide (SiC), other liner materials, or any combinations thereof.

Referring again to FIG. 1, at least one air gap, e.g., air gaps 140a and 140b, can be disposed between the dielectric layer 110 and the interconnect structures 120 and 121, respectively. Though the cross-sectional view of FIG. 1 shows two air gaps 140a each being disposed adjacent the opposite sidewall of the dielectric layer 110, the scope of this application is not limited thereto. In some embodiments from a top view of the integrated circuit 100, the air gaps 140a are configured around the pattern of the interconnect structure 120. In the top view of the integrated circuit 100, a single air gap 140a is disposed around the interconnect structure 120.

Due to the air gaps 140a and 140b, the equivalent dielectric constant between the interconnect structures 120 and 121 can be reduced. The parasitic capacitance between the interconnect structures 120 and 121 can be reduced, too. The RC time delay resulting from the parasitic capacitance can be desirably improved. In some embodiments, each of the air gaps 140a and 140b can have a width "W" and the interconnect structure 120 and 121 can have a pitch width "P". In some embodiments, a ratio of the width "W" to the pitch width "P" can be in a range from about 1/15 to about 1/4.

Referring to FIG. 1, at least one liner material, such as liner materials 150a, can be disposed below the air gaps 140a and between the dielectric layer 110 and the liner materials 130a. In some embodiments, the interconnect structure 120 is a damascene structure, e.g., a single damascene structure or a dual damascene structure. The interconnect structure 120 can include a metallic line 120a and a via region 120b. The liner materials 150a can be disposed around the via region 120b.

In some embodiments, each of the liner materials 130a and 150a can be made of at least one material, such as silicon oxide, silicon nitride, silicon oxynitride (SiON), silicon oxycarbide (SiOC), silicon carbon nitride (SiCN), silicon carbon oxynitride (SiCON), silicon carbide (SiC), other liner materials, or any combinations thereof. In some embodiments, the liner material 130a and the liner material 150a are made of different materials or different combination of materials. For example, the liner material 130a can be made of at least one material, such as silicon nitride, silicon oxynitride (SiON), silicon oxycarbide (SiOC), silicon carbon nitride (SiCN), silicon carbon oxynitride (SiCON), silicon carbide (SiC), other liner materials, or any combinations thereof. The liner materials 150a can be made of at least one material, such as silicon oxide, substantially carbon-free silicon oxide, other materials that have an etch selectivity to the liner materials 130a of about 10:1 or more, or any combinations thereof. In other embodiments, an etch selectivity of the liner materials 150a to the dielectric layer 110 can be about 10:1 or more.

It is noted that the integrated circuit 100 including the air gaps 140a and 140b described above in conjunction with FIG. 1 is merely exemplary. In some embodiments, at least one of an ESL, a dielectric layer, via plugs, metallic regions, metallic lines, passivation layers, other semiconductor structures (not shown), or any combinations thereof can be formed over the structure shown in FIG. 1.

The ESL (not shown) can include at least one material, such as silicon oxide, silicon nitride, silicon oxynitride, silicon carbide, silicon oxycarbide, other dielectric material, or any combinations thereof. The dielectric layer (not shown) may include materials such as silicon oxide, silicon nitride, silicon oxynitride, low-k dielectric material, ultra low-k dielectric material, or any combinations thereof. The via plugs, metallic regions, and/or metallic lines (not shown) can include materials such as tungsten, aluminum, copper, titanium, tantalum, titanium nitride, tantalum nitride, nickel silicide, cobalt silicide, other proper conductive materials, and/or combinations thereof.

Figure 2:
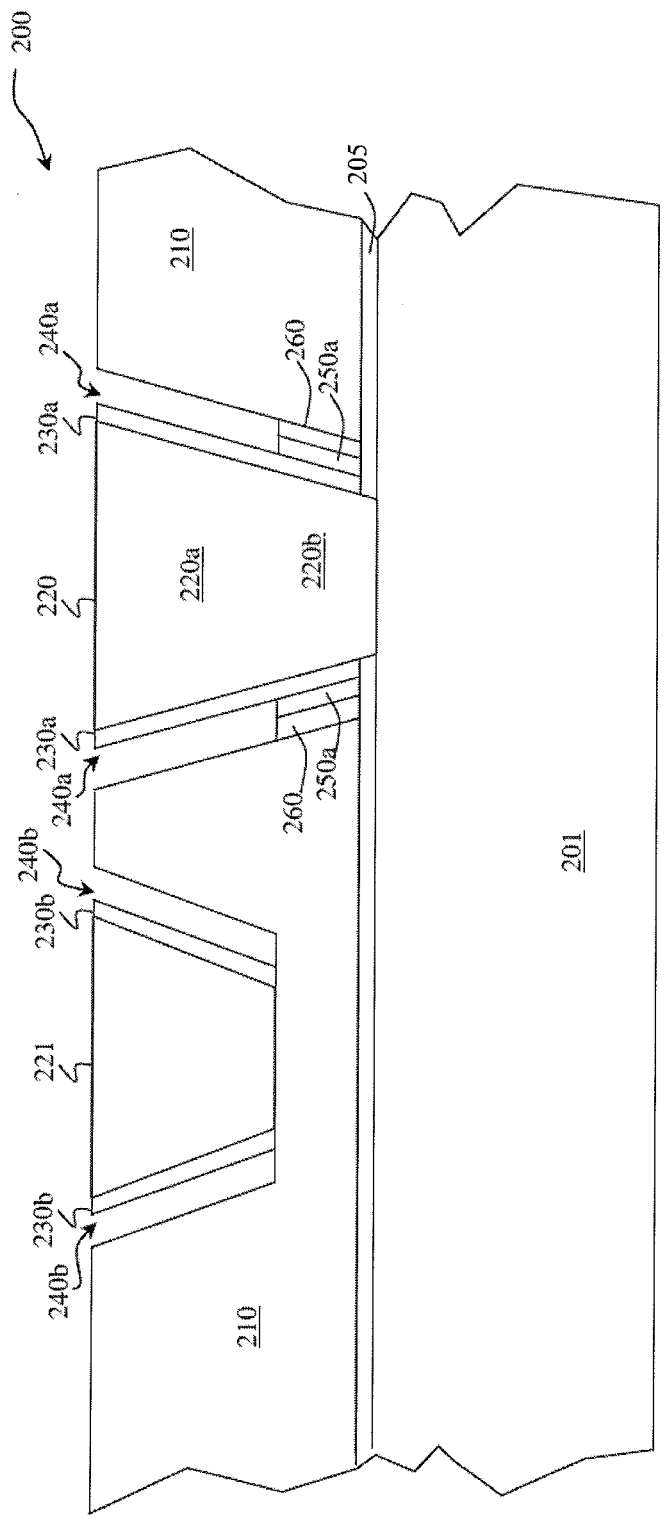
FIG. 2 is a schematic cross-sectional view of a second exemplary integrated circuit including at least one air gap that is disposed around an interconnect structure.

FIG. 2 is a schematic cross-sectional view of a second exemplary integrated circuit including at least one air gap disposed around an interconnect structure. Items of FIG. 2 that are the same items in FIG. 1 are indicated by the same reference numerals, increased by 100. For example, as depicted in FIG. 2, an integrated circuit 200 includes an etch stop layer (ESL) 205 and a dielectric layer 210 over a substrate 201, interconnect structures 220 and 221, liner materials 230a and 230b around the interconnect structures 220 and 221, and air gaps 240a and 240b between the dielectric layer 210 and the interconnect structures 220 and 221, respectively. The interconnect structure 220 includes a metallic line 220a and a via region 220b. The liner materials 250a are around the via region 220b. In FIG. 2, at least one damage layer, e.g., damage layers 260, can be disposed between liner materials 250a and the dielectric layer 210. In some embodiments, the damage layers 260 can include at least one material, such as silicon oxide, substantially carbon-free silicon oxide, other SiOH-containing dielectric materials, or any combinations thereof. In some other embodiments, the damage layers 260 can be formed by subjecting sidewalls of the dielectric layer 210 to an ashing gas, e.g., an oxygen ashing gas. Due to the ashing process, temporary, expendable oxidized sidewall portions of the dielectric layer 210 can be formed.

Figure 3:
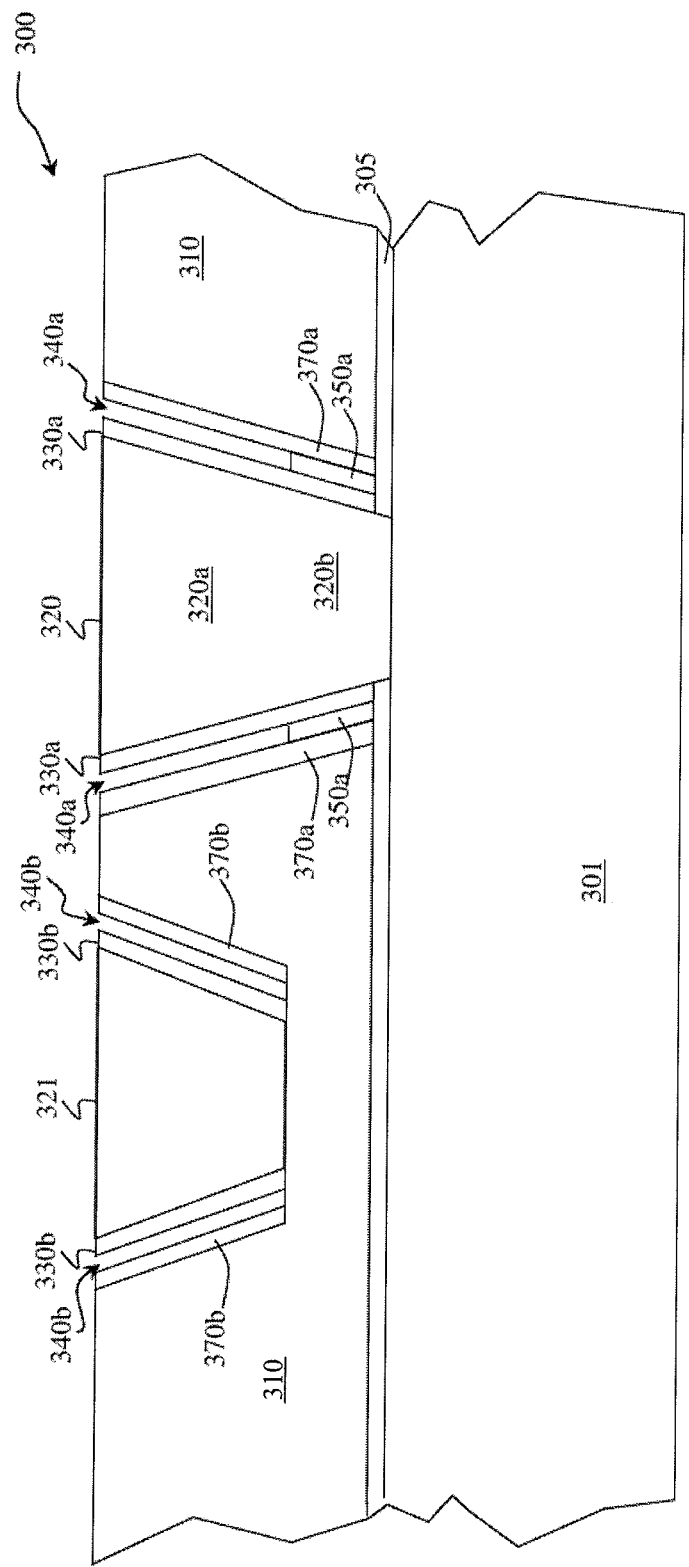
FIG. 3 is a schematic cross-sectional view of a third exemplary integrated circuit including at least one air gap that is disposed around an interconnect structure.

FIG. 3 is a schematic cross-sectional view of a third exemplary integrated circuit including at least one air gap disposed around an interconnect structure. Items of FIG. 3 that are the same items in FIG. 1 are indicated by the same reference numerals, increased by 200. For example, as depicted in FIG. 3, an integrated circuit 300 includes an etch stop layer (ESL) 305 and a dielectric layer 310 over a substrate 301, interconnect structures 320 and 321, liner materials 330a and 330b around the interconnect structures 320 and 321, and air gaps 340a and 340b between the dielectric layer 310 and the interconnect structures 320 and 321, respectively. The interconnect structure 320 includes a metallic line 320a and a via region 320b. The liner materials 350a are around the via region 320b. In FIG. 3, the integrated circuit 300 can include at least one liner material, e.g., liner materials 370a and 370b. Air gaps 340a can be formed between the liner materials 330a and 370a and air gaps 340b can be formed between the liner materials 330b and 370b. In some embodiments, the liner materials 370a and 370b can include at least one material such as silicon nitride, silicon oxynitride (SiON), silicon oxycarbide (SiOC), silicon carbon nitride (SiCN), silicon carbon oxynitride (SiCON), silicon carbide (SiC), or other liner materials to which an etch selectivity of the liner materials 350a is about 10:1 or more.

Figure 4A:
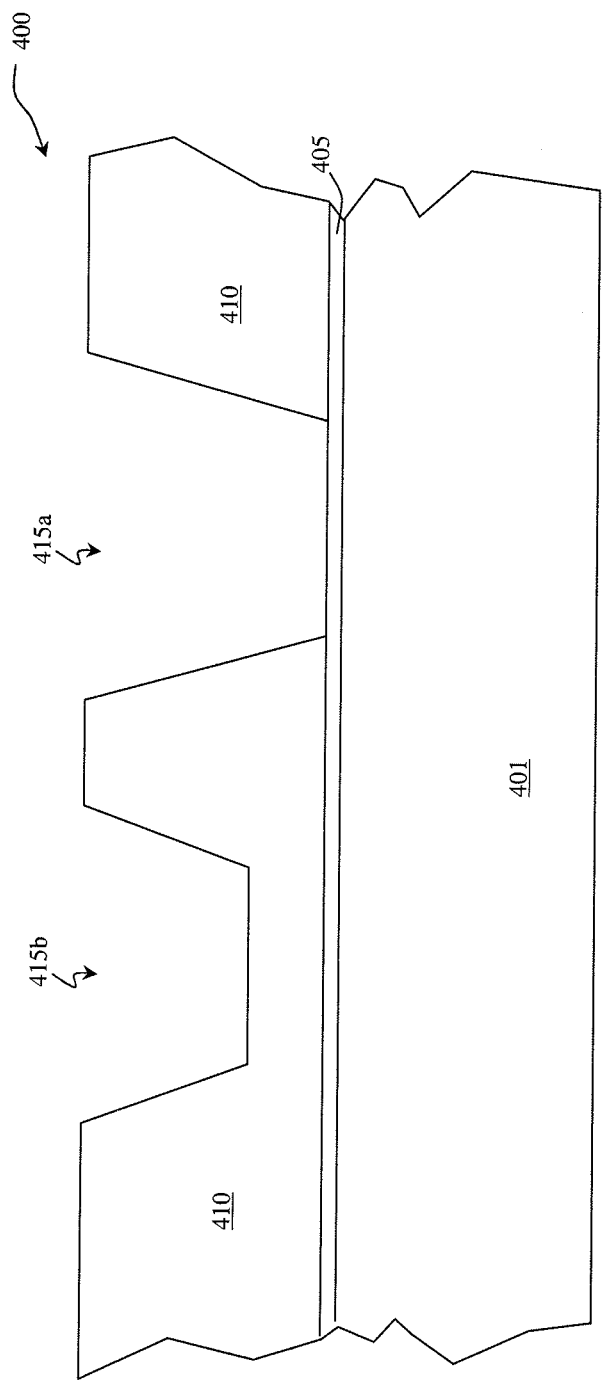
FIGS. 4A-4E are schematic cross-sectional views illustrating an exemplary method of forming an exemplary integrated circuit.

FIGS. 4A-4E are schematic cross-sectional views illustrating an exemplary method of forming the exemplary integrated circuit 100 described above in conjunction with FIG. 1 according to some embodiments. Items of FIG. 4 that are the same items in FIG. 1 are indicated by the same reference numerals, increased by 300. In FIG. 4A, an etch stop layer (ESL) 405 of an integrated circuit 400 can be formed over a substrate 401. The ESL 405 can be formed, for example, by plasma enhanced chemical vapor deposition (PECVD), CVD, such as high-density plasma CVD (HDPCVD), atomic layer CVD (ALCVD), or the like.

Referring to FIG. 4A, a dielectric layer 410 can be formed over the ESL 405. The dielectric layer 410 may be formed, for example, by a CVD process, a PECVD process, a HDP CVD process, a HARP, a spin-coating process, another deposition process, or any combinations thereof. At least one opening, e.g., openings 415a and 415b, can be formed in the dielectric layer 410. The opening 415a can expose at least a portion of the ESL 405. In some embodiments, the openings 415a and 415b can be formed by defining a photoresist pattern (not shown) over a dielectric material that is deposited for forming the dielectric layer 410. A dry etch process uses the photoresist pattern as a mask to remove portions of the dielectric material for defining the openings 415a and 415b. The ESL 405 can protect the substrate 401 from being damaged by the dry etch process. After the openings 415a and 415b are formed, the photoresist pattern can be removed.

Figure 4B:
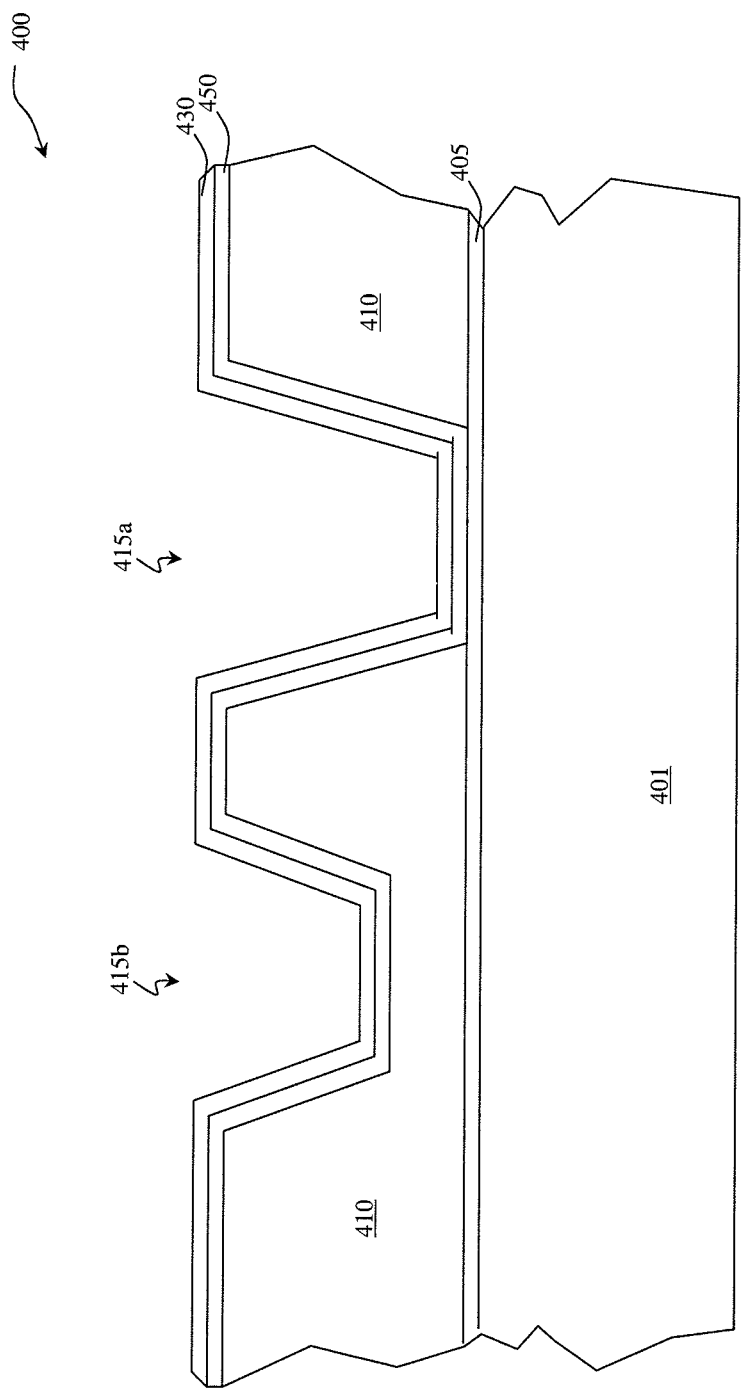

Referring to FIG. 4B, liner layers 450 and 430 can be sequentially formed over the dielectric layer 410. In some embodiments, the liner layers 450 and 430 can be substantially conformal over the dielectric layer 410. Each of the liner layers 450 and 430 can be formed, for example, by atomic layer deposition (ALD), chemical vapor deposition (CVD), physical vapor deposition (PVD), remote plasma CVD (RPCVD), plasma enhanced CVD (PECVD), other suitable deposition processes, or any combinations thereof.

Figure 4C:
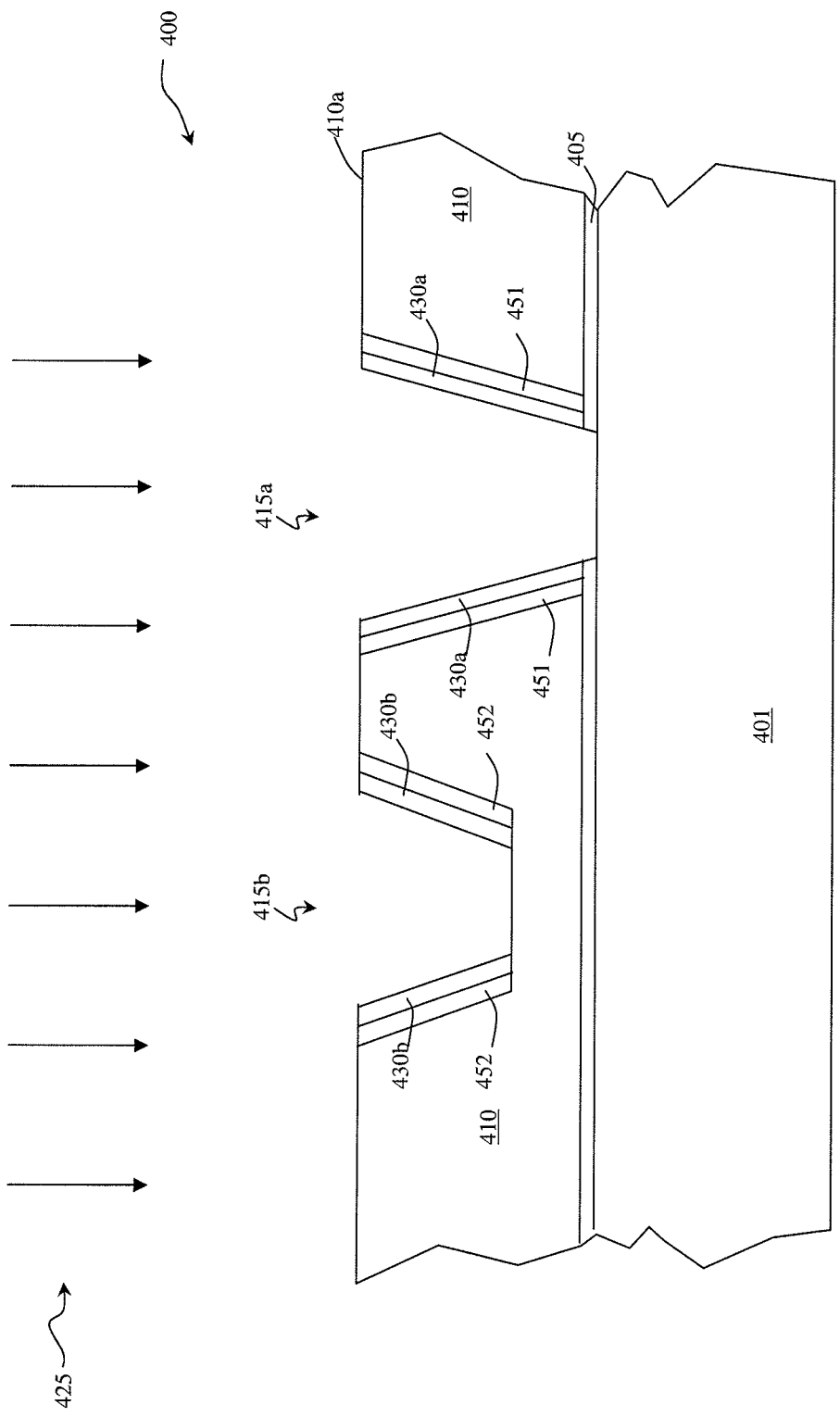

Referring to FIG. 4C, a removing process 425 can remove portions of the liner layers 430 and 450 (shown in FIG. 4B) for defining liner materials 430a-430b and liner layers 451-452 adjacent sidewalls of the dielectric layer 410. In some embodiments, the removing process 425 can remove the top portions of the liner layers 430 and 450 that are over the top surface 410a of the dielectric layer 410 and bottom portions of the liner layers 430 and 450. In some embodiments, the removing process 425 can also remove a portion of the ESL 405 so as to expose a portion of the surface of the substrate 401. The removing process 425 can include a dry etch process, a dry plasma etch process, an ashing plasma process, a wet etch process, or any combinations thereof.

Figure 4D:
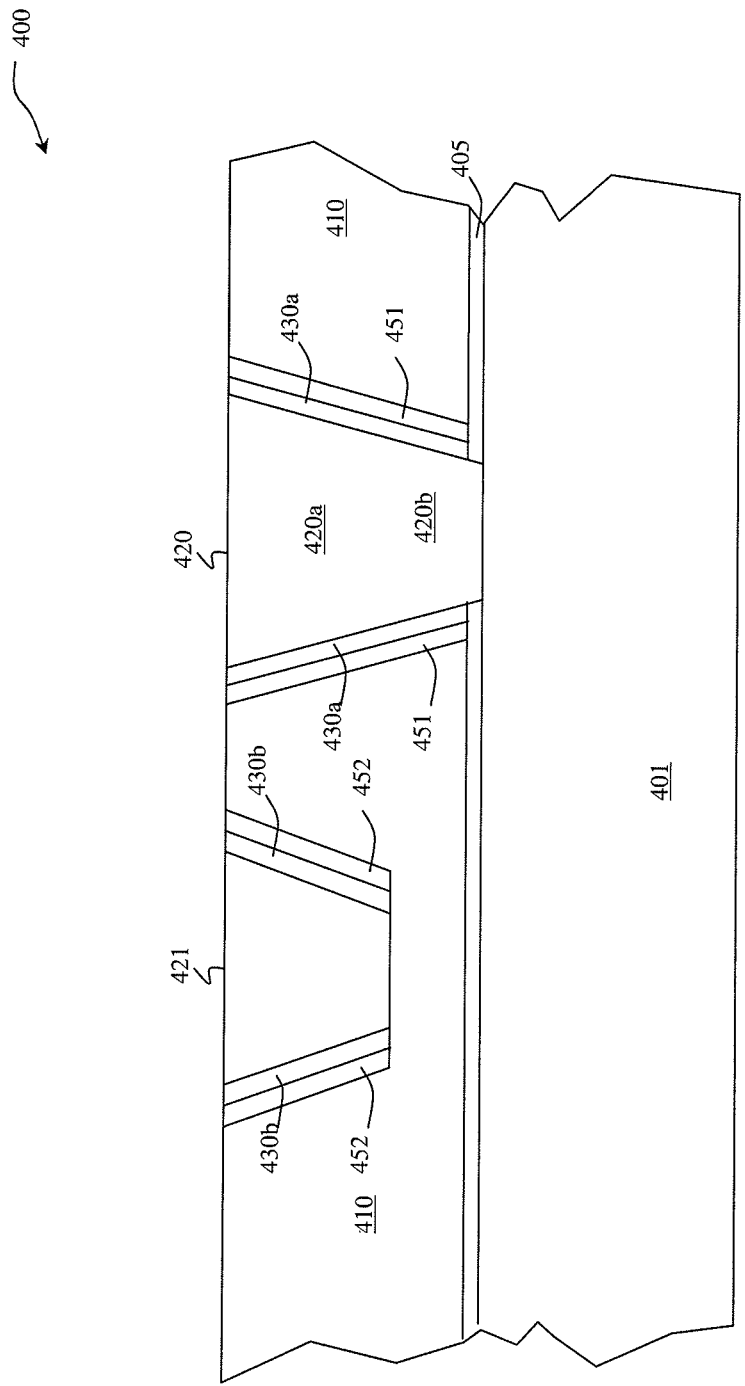

Referring to FIG. 4D, interconnect structures 420 and 421 can be formed in the openings 415a and 415b, respectively. In some embodiments, a metallic layer that is deposited for forming the interconnect structures 420 and 421 can be formed in the openings 415a and 415b and over the dielectric layer 410. The metallic layer can include at least one material, such as copper, tungsten, Al, Al/Cu, other conductive materials, or combinations thereof and can be deposited by a CVD, PVD, ALD, electroplating method, and/or other process. The metallic layer deposited over the dielectric layer 410 can be removed by a chemical mechanical polish (CMP) process (not shown) for defining the interconnect structures 420 and 421. After the CMP process, the top surfaces of the liner materials 430a-430b and the liner layers 451-452 can be substantially level with the top surfaces of the interconnect structures 420 and 421. The top surfaces (not labeled) of the liner materials 430a-430b and the liner layers 451-452 are exposed as shown in FIG. 4D.

Figure 4E:
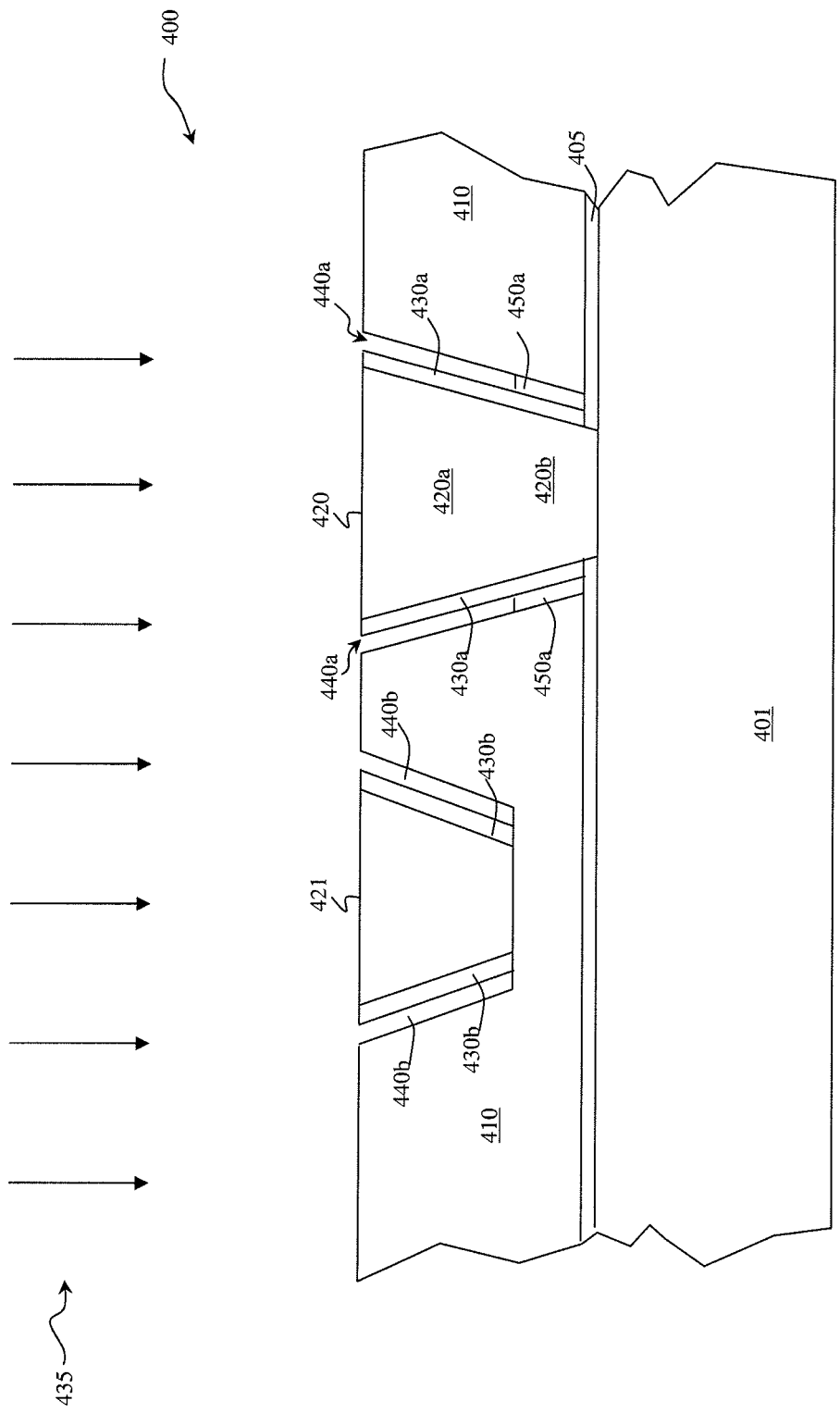

Referring to FIG. 4E, a removing process 435 can substantially remove all the liner layers 452 and remove portions of the liner layers 451 (shown in FIG. 4D) for forming air gaps 440b and 440a, respectively. The remaining portions of the liner layers 451, i.e., the liner materials 450a, can be defined below the air gaps 440a. In some embodiments, chemicals and/or compositions in a liquid or gaseous state may be used to dissolve the liner layers 452 and the portions of the liner layers 451 through their exposed top surfaces. The chemicals and/or compositions selected do not substantially etch or damage the dielectric material 410 and the liner materials 430a and 430b to a degree that might adversely affect the reliability of the integrated circuit 400. In other embodiments, the removing process 435 can have an etch selectivity of the liner layers 451-452 to the dielectric material 410 of about 10:1 or more. In still other embodiments, the removing process 435 can also have an etch selectivity of the liner layers 451-452 to the liner materials 430a-430b of about 10:1 or more.

In some embodiments, a wet etching may be used to form the air gaps 440a and 440b by dipping the integrated circuit 400 in a dilute hydrofluoric acid (HF) based solution that reacts with and dissolves the liner layers 452 and the portions of the liner layers 451. The HF acid-based solution may be relatively dilute, which in some exemplary embodiments may contain 5% or less of HF acid. In some other embodiments, the HF acid-based solution may contain approximately 1% concentration of HF acid. Such concentrations of HF acid may be used without significant adverse effects on the dielectric material 410 and the liner materials 430a-430b. Representative dip times may be from a few seconds to about 60 minutes depending on the concentration of the HF solution used, which affects the aggressiveness of the solution and material etching rates. In some embodiments, the chemicals and/or compositions selected do not substantially damage the interconnect structures 420 and 421. It will be appreciated that other chemicals and/or compositions, and dry etching techniques may be used to dissolve and remove the liner layers 452 and the portions of the liner layers 451 to form the air gaps 430b and 430a, respectively.

As note, the thickness of the liner layer 450 can be substantially conformal over the dielectric layer 410. Since the air gaps 430b and 430a are formed by removing the liner layers 452 and the portions of the liner layers 451, respectively, the width of the air gaps 430a and 430b can be desirably controlled. The width of the air gaps 430a and 430b can be substantially equal to each other. By forming the air gaps 430a and 430b having the substantially uniform width, the parasitic capacitance between interconnect structures can be desirably controlled. Desired uniform electrical performances of the integrated circuit 400 can be achieved.

It is noted that the method of forming the integrated circuit 400 described above in conjunction with FIGS. 4A-4E is merely exemplary. In some embodiments, at least one of an ESL, a dielectric material, via plugs, metallic regions, and/or metallic lines (not shown) can be formed over the structure shown in FIG. 1. The ESL can be formed, for example, by plasma enhanced chemical vapor deposition (PECVD), CVD process, such as high-density plasma CVD (HDPCVD), atomic layer CVD (ALCVD), or the like. The via plugs, metallic regions, and/or metallic lines can be formed, for example, by at least one of deposition processes, photolithographic processes, etch processes, CMP processes, cleaning process, or any combinations thereof.

In some embodiments, the method described above in conjunction with FIGS. 4A-4E can be modified to form the integrated circuit 200 described above in conjunction with FIG. 2. In this embodiment, the sidewalls of the dielectric layer 410 (shown in FIG. 4A) can be subjected to a dry ashing process (not shown). Damage portions that are configured for forming the damage layers (described in conjunction with FIG. 2) can be formed on the exposed sidewalls of the dielectric layer 410. The dielectric layer 410 can be treated by the ashing gas and damaged or oxidized by reaction of the oxygen ashing gas plasma with the dielectric material 410 to produce a temporary, expendable damage layers on the sidewalls of the dielectric layer 410. The liner layers 450 and 430 (shown in FIG. 4B) are then sequentially formed over the damage layers. Each of the damage layers is formed between the dielectric layer 410 and the liner layer 450.

In some embodiments, the damage layers may contain SiOH resulting from a chemical reaction of the dielectric layer 410 with an oxygen plasma ashing gas. The length of time that the sidewalls of the dielectric layer 410 are exposed to the oxygen plasma ashing gas, thereby allowing the oxygen plasma ashing gas to diffuse into the dielectric layer 410, can be used to control the depth of the damage layers.

While removing the liner layers 452 and the portions of the liner layers 451, the removing process 435 can remove portions of the damage portions so as to define the damage layers 260 as shown in FIG. 2. As noted, the damage layers can be formed between the liner materials 450a and the dielectric layer 410.

In some other embodiments, the method described above in conjunction with FIGS. 4A-4E can be modified to form the integrated circuit 300 described above in conjunction with FIG. 3. In this embodiment, another liner layer (that is deposited for forming the liner materials 370a and 370b shown in FIG. 3) can be formed and substantially conformal over the liner layer 430 (shown in FIG. 4B). As noted, the liner materials 450a and 450b can have an etch selectivity to the liner layer of about 10:1 or more. The removing process 435 can remove portions of the liner materials 450a and the liner materials 450b, forming the air gaps between to liner materials. The air gaps having a substantially uniform width can be achieved.

Figure 5:
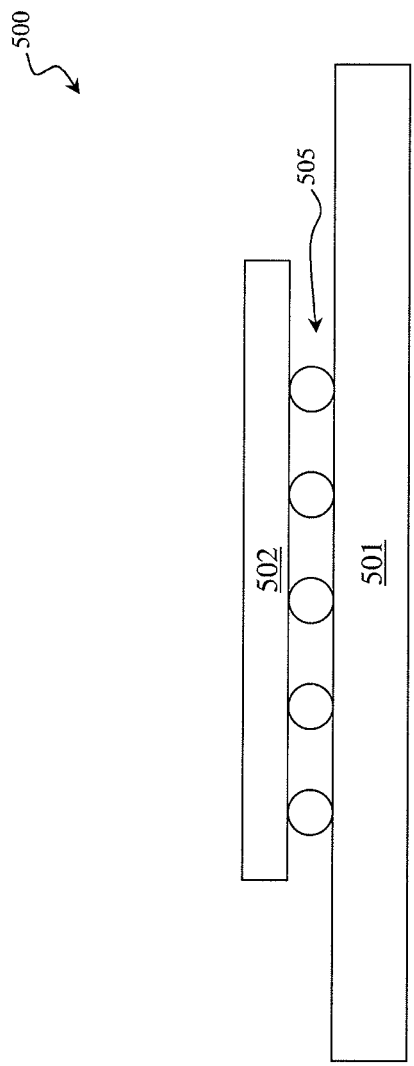
FIG. 5 is a schematic drawing illustrating a system including an exemplary integrated circuit disposed over a substrate board.

FIG. 5 is a schematic drawing illustrating a system including an exemplary integrated circuit disposed over a substrate board. In FIG. 5, a system 500 can include an integrated circuit 502 disposed over substrate board 501. The substrate board 501 can include a printed circuit board (PCB), a printed wiring board and/or other carrier that is capable of carrying an integrated circuit. The integrated circuit 502 can be similar to the integrated circuit 100, 200, or 300 described above in conjunction with FIGS. 1-3, respectively. The integrated circuit 502 can be electrically coupled with the substrate board 501. In some embodiments, the integrated circuit 502 can be electrically coupled with the substrate board 501 through bumps 505. In some other embodiments, the integrated circuit 502 can be electrically coupled with the substrate board 501 through wire bonding. The system 500 can be part of an electronic system such as computers, wireless communication devices, computer-related peripherals, entertainment devices, or the like.

In some embodiments, the system 500 including the integrated circuit 502 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single system.

One aspect of this description relates to an integrated circuit. The integrated circuit includes an interconnect structure disposed at least partially in at least one opening of a dielectric layer. The integrated circuit further includes at least one air gap disposed between the dielectric layer and the interconnect structure. The integrated circuit further includes at least one first liner material disposed under the at least one air gap, the at least one first liner material extending along a bottom portion of a sidewall of the at least one opening of the dielectric layer.

Another aspect of this description relates to a system including a substrate board and an integrated circuit electrically connected to the substrate board. The integrated circuit includes an interconnect structure disposed at least partially in at least one opening of a dielectric layer. The integrated circuit further includes at least one air gap disposed between the dielectric layer and the interconnect structure. The integrated circuit further includes at least one first liner material disposed under the at least one air gap, the at least one first liner material extending along a bottom portion of a sidewall of the at least one opening of the dielectric layer.

Still another aspect of this description relates to an integrated circuit. The integrated circuit further includes a first interconnect structure in a first opening of a dielectric layer. The integrated circuit further includes a second interconnect structure in a second opening of the dielectric layer separate from the first opening, the second opening having a depth different from a depth of the first opening. The integrated circuit further includes a first air gap between the dielectric layer and the first interconnect structure. The integrated circuit further includes a first liner disposed below the first air gap, the first liner extending along a bottom portion of a sidewall of the first opening. The integrated circuit further includes a second air gap between the dielectric layer and the second interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   an interconnect structure disposed at least partially in at least one opening of a dielectric layer;
   at least one air gap disposed between the dielectric layer and the interconnect structure; and
   at least one first liner material disposed under the at least one air gap, the at least one first liner material extending along a bottom portion of a sidewall of the at least one opening of the dielectric layer,
   wherein a top portion of the first liner material is below a lowest portion of the air gap.

2. The integrated circuit of claim 1, further comprising a damage layer between the first liner material and the dielectric layer, the damage layer comprising at least one of silicon oxide, or a SiOH-containing dielectric material.

3. The integrated circuit of claim 1, further comprising an etch stop layer over a substrate, the etch stop layer having an opening exposing a portion of the substrate,
   wherein the dielectric layer is over the etch stop layer, and the interconnect structure contacts the exposed portion of the substrate.

4. The integrated circuit of claim 3, wherein the first liner is over the etch stop layer.

5. The integrated circuit of claim 1, further comprising a barrier layer between the first liner and the interconnect structure.

6. A system comprising:
   a substrate board; and
   an integrated circuit electrically connected to the substrate board, the integrated circuit comprising:
      an interconnect structure disposed at least partially in at least one opening of a dielectric layer,
      at least one air gap disposed between the dielectric layer and the interconnect structure,
      at least one first liner material disposed under the at least one air gap, the at least one first liner material extending along a bottom portion of a sidewall of the at least one opening of the dielectric layer, and
      a damage layer between the first liner material and the dielectric layer.

7. The system of claim 6, wherein the damage layer further comprises at least one of silicon oxide, or an SiOH-containing dielectric material.

8. The system of claim 6, wherein the integrated circuit further comprises an etch stop layer over an integrated circuit substrate, the etch stop layer having an opening exposing a portion of the integrated circuit substrate,
   wherein the dielectric layer is over the etch stop layer, and the interconnect structure contacts the exposed portion of the integrated circuit substrate.

9. The system of claim 8, wherein the first liner is over the etch stop layer.

10. The system of claim 6, wherein the integrated circuit further comprises a barrier layer between the first liner and the interconnect structure.

11. An integrated circuit comprising:
    a first interconnect structure in a first opening of a dielectric layer;
    a second interconnect structure in a second opening of the dielectric layer separate from the first opening, the second opening having a depth different from a depth of the first opening;
    a first air gap between the dielectric layer and the first interconnect structure;
    a first liner disposed below the first air gap, the first liner extending along a bottom portion of a sidewall of the first opening; and
    a second air gap between the dielectric layer and the second interconnect structure,
    wherein at least one of the first air gap or the second air gap has a constant width.

12. The integrated circuit of claim 11, wherein a bottom surface of the second air gap directly contacts the dielectric layer.

13. The integrated circuit of claim 11, further comprising a damage layer between the first liner layer and the dielectric layer.

14. The integrated circuit of claim 11, further comprising:
    a second liner layer between the first liner layer and the dielectric layer;
    a third liner layer between the second air gap and the dielectric layer.

15. The integrated circuit of claim 14, wherein the second liner layer is between the first air gap and the dielectric layer.

16. The integrated circuit of claim 11, further comprising:
    a second liner layer between the first liner layer and the first interconnect structure;
    a third liner layer between the second air gap and the second interconnect structure.

17. The integrated circuit of claim 16, wherein the second liner layer is between the first air gap and the first interconnect structure.

18. The integrated circuit of claim 11, wherein a pitch equals a distance between a center of the first interconnect structure and a center of the second interconnect structure, and a width of the first air gap is substantially equal to a width of the second air gap, and a ratio of the pitch to the width of the first air gap ranges from about 1/15 to about 1/4.

19. The integrated circuit of claim 11, further comprising an etch stop layer over a substrate, the etch stop layer having an opening exposing a portion of the substrate, wherein the dielectric layer is over the etch stop layer, and the first interconnect structure contacts the exposed portion of the substrate.

20. The integrated circuit of claim 19, wherein the dielectric layer is between a bottom surface of the second interconnect structure and the etch stop layer.

\* \* \* \* \*